(12) United States Patent
Lyu

(10) Patent No.: US 6,442,371 B1
(45) Date of Patent: Aug. 27, 2002

(54) POLARIZATION MEASURING APPARATUS IN A MOBILE COMMUNICATION SYSTEM

(75) Inventor: Jae Woo Lyu, Seoul (KR)

(73) Assignee: LG Information & Communications, Ltd., Seoul (KR)

( * ) Notice: Subject to any disclaimer, the term of this patent is extended or adjusted under 35 U.S.C. 154(b) by 0 days.

(21) Appl. No.: 09/461,109

(22) Filed: Dec. 14, 1999

(30) Foreign Application Priority Data

| Dec. 17, 1998 | (KR) | ............................................. 98-55620 |
| Oct. 4, 1999 | (KR) | ............................................. 99-42546 |

(51) Int. Cl.⁷ ............................................. H04B 17/00
(52) U.S. Cl. .................... 455/67.1; 455/67.3; 455/67.4; 324/76.19; 324/637; 343/703; 702/57
(58) Field of Search .................... 455/67.1, 69, 70, 455/423, 425, 522, 67.2, 67.4, 67.3; 342/361, 362, 846; 343/700, 703, 756, 853; 324/627, 72.5, 637, 76.19; 702/57

(56) References Cited

U.S. PATENT DOCUMENTS

| RE28,546 E | * | 9/1975 | Foldes ........................ 343/176 |
| 4,929,960 A | * | 5/1990 | Kaylor et al. ................ 343/703 |
| 5,825,331 A | * | 10/1998 | Lee ............................. 343/703 |
| 6,282,408 B1 | * | 8/2001 | Jang ............................ 455/561 |
| 6,356,771 B1 | * | 3/2002 | Dent ........................ 455/277.1 |

FOREIGN PATENT DOCUMENTS

| JP | 03035175 | * | 2/2002 |

* cited by examiner

Primary Examiner—Dwayne Bost
Assistant Examiner—Ahmed Lahjouji
(74) Attorney, Agent, or Firm—Fleshner & Kim, LLP

(57) ABSTRACT

A polarization measuring apparatus in a mobile radio communication system which can accurately measure a polarized wave of a code division multiple access (CDMA) signal. The apparatus can measure the property of an elliptically polarized wave of a received radio wave as well as the property of a linearly polarized wave, and can measure the polarization property of the received radio wave more accurately by compensating for the error of internal radio frequency (RF) elements used for the polarization measurement and the loss on internal paths produced during the polarization measurement.

11 Claims, 7 Drawing Sheets

A: axial ratio
T: tilt angle

POLARIZATION MEASURING APPARATUS IN A MOBILE COMMUNICATION SYSTEM

BACKGROUND OF THE INVENTION

1. Field of the Invention

The present invention relates generally to a polarization measuring apparatus in a mobile communication system. In particular, the present invention relates to a polarization measuring apparatus in a mobile radio communication system which can accurately measure a polarized wave of a code division multiple access (CDMA) signal.

2. Description of the Related Art

Generally, a radio wave is polarized. This means that the direction of an electric field, which is perpendicular to the forwarding direction of propagation of the radio wave, leans to a specific direction. This appearance is called polarization.

Particularly, in wireless communications, the polarization is a very important factor when an antenna is selected and installed. The polarized wave is classified into a linearly polarized wave, a circularly polarized wave, etc.

The linearly polarized wave has a constant plane of polarization having the direction of the electric field and the propagation direction. Specifically, a horizontally polarized wave has the polarization plane parallel to the ground, and a vertically polarized wave has the polarization plane perpendicular to the ground.

The circularly polarized wave is a wave wherein an electric field vector, which represents the magnitude and direction of the electric field on the plane perpendicular to the propagation direction, rotates in a constant direction. As one of the circularly polarized wave exists an elliptically polarized wave wherein an elliptical trace is drawn by the terminal point of the electric field vector.

The elliptically polarized wave has various properties, and factors representing such properties are axial ratios, tilt angles, etc.

The axial ratio is also called an ellipticity, and represents the difference between the maximum and minimum peaks of the electric field vector rotating through all angles, i.e., the ratio of an electric field intensity in the direction of a major axis to that in the direction of a minor axis. Also, the tilt angle represents the tilting extent of the major axis for a specific criterion axis.

In a mobile communication system, it is required to accurately measure the polarization. Especially, in case of a mobile communication system using a high frequency band such as a personal communication service (PCS) system and a next-generation mobile communication system, it is important to perform the accurate modeling of the wave propagation by an accurate polarization measurement and also to realize a polarization diversity.

Here, the polarization diversity is for removing unstable characteristics such as fading by radiating from vertical and horizontal antennas radio waves having different leans from each other. In order to realize the polarization diversity, antenna installation variables such as the directional angle of the antennas, length of the antennas, etc. are first determined, and then the antennas are installed considering the determined variables.

The polarization measuring apparatus of the mobile communication system performs the polarization measurement required for the accurate modeling of the wave propagation and the determination of the antenna installation variables as described above.

FIG. 1 is a view illustrating the construction of a conventional polarization measuring apparatus.

As illustrated in FIG. 1, the conventional polarization measuring apparatus includes a linear antenna 1 and a received power measuring instrument 2.

The linear antenna 1 is rotatable by 360°, and is connected to the received power measuring instrument 2 by power lines.

The received power measuring instrument 2 measures the power value of a received wave at the respective rotational positions of the linear antenna 1. Thus, the polarization property of the received wave is obtained by measuring the rotational angle when the power value of the radio wave incident to the linear antenna 1 rotating by 360° is maximum.

As a result, only information on the linearly polarized wave with a constant plane of polarization having the electric field direction and the propagation direction is provided due to the constructional characteristic of the conventional polarization measuring apparatus.

Accordingly, it is impossible to accurately measure the information on various polarized waves which may be produced if a wide frequency band signal such as the CDMA signal is used.

Also, no equipment has been developed for measuring such an accurate information on the elliptically polarized wave wherein the electric field direction occasionally varies with respect to the propagation direction though such an accurate information is required in order to perform the accurate modeling of the propagation and to realize the polarization diversity in the CDMA environment where a number of scattering substances exist.

SUMMARY OF THE INVENTION

Accordingly, the present invention is directed to a polarization measuring apparatus in a mobile communication system that substantially obviate one or more of the problems due to limitations and disadvantages of the related art.

An object of the present invention is to provide a polarization measuring apparatus in a mobile communication system which can measure the property of an elliptically polarized wave of a received radio wave as well as the property of a linearly polarized wave.

It is another object of the present invention to provide a polarization measuring apparatus in a mobile communication system which can measure the polarization property of the received radio wave more accurately by compensating for the error of internal radio frequency (RF) elements used for the polarization measurement and the loss on internal paths produced during the polarization measurement.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the mobile communication system according to the present invention includes a polarization measuring apparatus for receiving power values of vertical and horizontal elements of an incident electric field for a received radio wave and measuring various polarization power values of the incident electric field, and a computer for receiving the measured polarization power values and analyzing polarization properties of the received radio wave.

The polarization measuring apparatus comprises a dual polarization antenna for outputting the power values of the vertical and horizontal elements of the incident electric field of the received radio wave, a polarization switch for switching to and outputting through different paths the power values of the respective elements of the incident electric field inputted from the dual polarization antenna, and a spectrum analyzer for measuring the respective polarization power values outputted from the polarization switch.

The polarization measuring apparatus further comprises a signal generator for generating a test signal having predetermined power value and frequency, an internal calibration block for outputting various polarization power values for the test signal provided from the signal generator by switching the test signal to the different paths, a first directional coupler for selectively outputting one of the vertical element power value of the incident electric field inputted from the dual polarization antenna and one polarization power value inputted from the internal calibration block, and a second directional coupler for selectively outputting one of the horizontal element power value of the incident electric field inputted from the dual polarization antenna and the other polarization power value inputted from the internal calibration block.

The computer calculates an ellipticity and a tilt angle of polarization of the received radio wave using the various polarization power values of the incident electric field provided from the polarization measuring apparatus and compensation information for the error of internal radio frequency (RF) elements and for the loss on internal paths of the polarization measuring apparatus.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
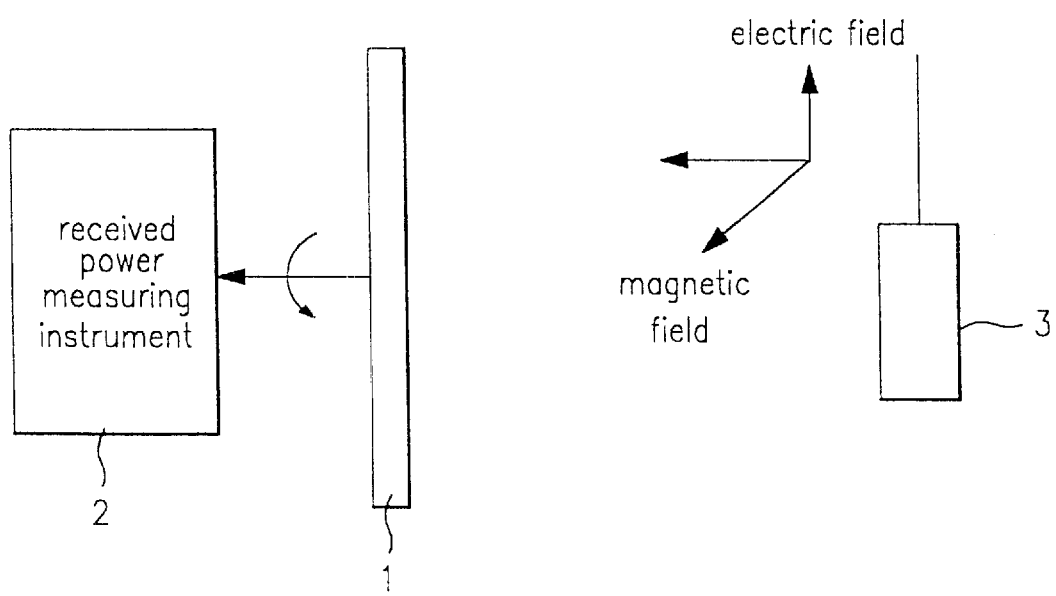
FIG. 1 is a view illustrating the construction of a conventional polarization measuring apparatus.
Figure 2:
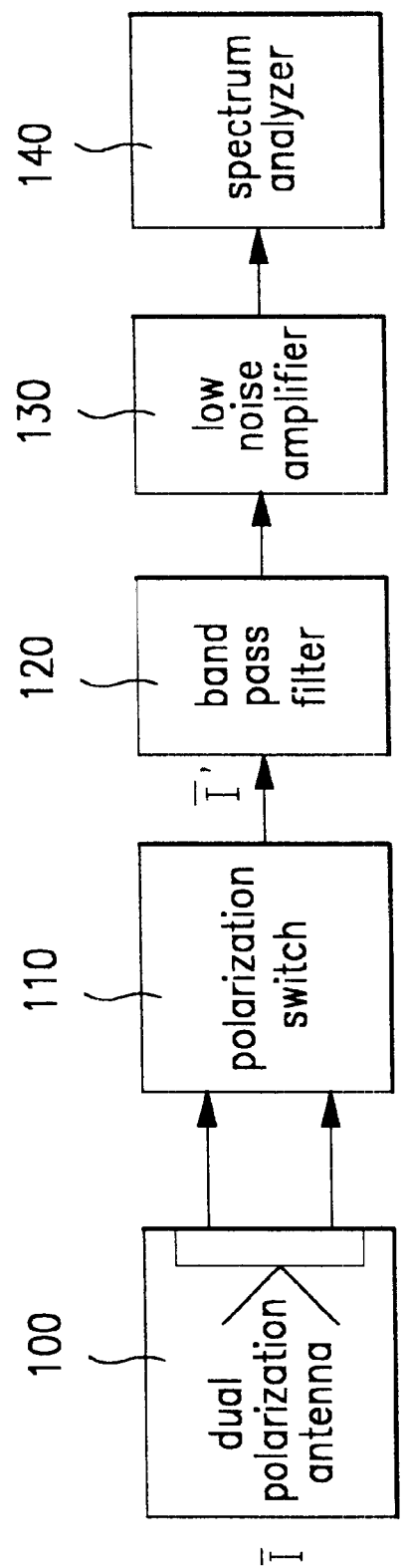
FIG. 2 is a block diagram illustrating the construction of the polarization measuring apparatus according to an embodiment of the present invention.

FIG. 2 is a block diagram illustrating the construction of the polarization measuring apparatus according to an embodiment of the present invention.

Referring to FIG. 2, the polarization measuring apparatus according to the present invention basically includes a dual polarization antenna 100 for outputting power values of vertical and horizontal elements of an incident electric field for a received radio wave.

The polarization measuring apparatus according to the present invention also includes a polarization switch 110, a band pass filter 120, a low noise amplifier 130, and a spectrum analyzer 140.

The polarization switch 110 receives the power values of the vertical and horizontal elements of the incident electric field outputted from the dual polarization antenna 100, and outputs to the band pass filter 120 respective signals which correspond to the power value Pr of the circularly polarized wave, power value Pv of the vertically polarized wave, power value Ph of the horizontally polarized wave, and power value Pt of the polarized wave tilted by 45° with respect to the vertically polarized wave of the incident electric field.

At this time, the band pass filter 120 removes noise component signals from its input signals, and outputs the required band signal to the low noise amplifier 130. The low noise amplifier 130 amplifies its input signal with a predetermine amplification factor, and transfers the amplified signal to the spectrum analyzer 140.

Thereafter, the spectrum analyzer 140 measures the power values of the respective polarized waves. of the incident electric field from its input signal, displays the measured power values with frequency spectrums, and provides the measured power values to a computer (not illustrated).

Since the spectrum analyzer 140 can arbitrarily change the measured frequency band for the polarization measurement by adjusting the resolution band width which is an internal setting variable, it adjusts the measured frequency band to a resolution band width which corresponds to the frequency band of the mobile communication system using the polarization measuring apparatus.

Now, the features of the polarization switch 110 provided in the polarization measuring apparatus will be explained in detail.

Figure 3:
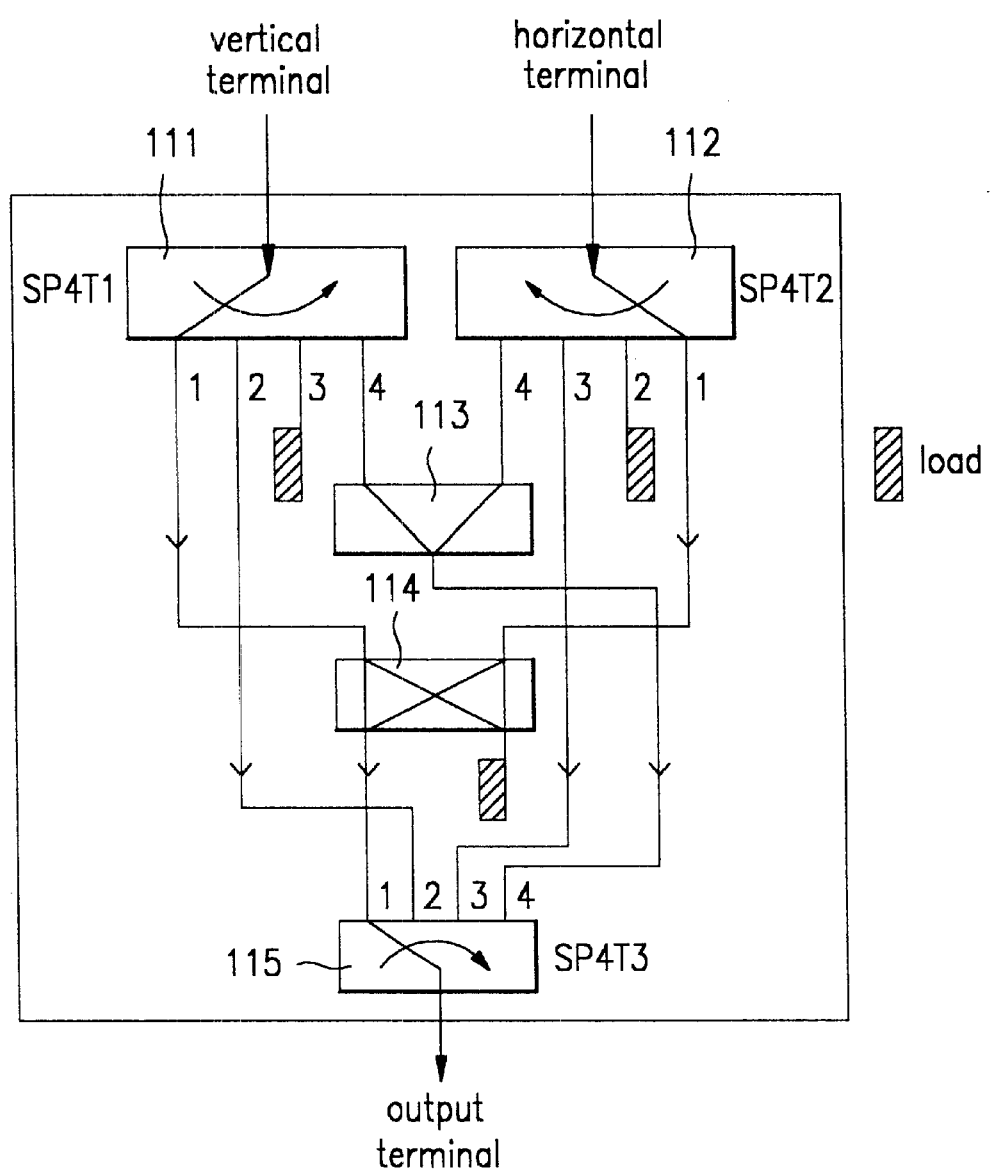
FIG. 3 is a view illustrating the structure of the polarization switch provided in the polarization measuring apparatus according to the present invention.

FIG. 3 is a view illustrating the internal structure of the polarization switch provided in the polarization measuring apparatus according to the present invention.

Referring to FIG. 3, the polarization switch 110 comprises single-pole four-throw (SP4T) switches 111, 112 and 115, a 2-way divider 113, and a quadrature-hybrid (Q-hybrid) coupler 114.

The dual polarization antenna 100 is provided with two power supply terminals, i.e., a vertical terminal and a horizontal terminal. The vertical terminal is connected to a first SP4T1 switch 111 provided on one input terminal of the polarization switch 110, and the horizontal terminal is connected to a second SP4T2 switch 112 provided on the other input terminal of the polarization switch 110.

A third SP4T3 switch 115 provided on an output terminal of the polarization switch 110 is connected to the band pass filter 120.

The SP4T switches 111, 112 and 115 included in the polarization switch 110 have five terminals, respectively, and one among the five terminals is switched to either of the remaining four terminals.

The sequence of the switching operation of the SP4T switches 111, 112 and 115 coincides with one another.

Specifically, when the input terminal of the first SP4T1 switch 111 is switched to its first output terminal, the input terminal of the second SP4T2 switch 112 is also switched to its first output terminal. At this time, the first input terminal of the third SP4T3 switch 115 is switched to its output terminal. Thereafter, the first to fourth terminals of the respective SP4T switches 111, 112 and 115 are then switched in sequence.

The output state of the polarization switch 110 in accordance with its sequential switching operation is as follows.

First, when all the SP4T switches 111, 112 and 115 are switched to their first terminals, respectively. The first terminal of the first SP4T1 switch 111 and the first terminal of the second SP4T2 switch 112 are respectively connected to input terminals of the Q-hybrid coupler 114. Thus, the Q-hybrid coupler 114 delays by 90° either of the power values of the vertical and horizontal elements of the incident electric field inputted to its two input terminals, and adds the delayed power value to the remaining power value. As a result, the power value Pr of the circularly polarized wave is outputted through the first terminal of the third SP4T3 switch 115.

Second, when all the SP4T switches 111, 112 and 115 are switched to their second terminals, respectively. The second terminal of the first SP4T1 switch 111 is directly connected to the second terminal of the third SP4T3 switch 115, and the second terminal of the second SP4T2 switch 112 is isolated. Thus, the power value of the vertical element of the inputted incident electric field, i.e., the power value Pv of the vertically polarized wave is outputted through the second terminal of the third SP4T3 switch 115.

Third, when all the SP4T switches 111, 112 and 115 are switched to their third terminals, respectively. The third terminal of the second SP4T2 switch 112 is directly connected to the third terminal of the third SP4T3 switch 115, and the third terminal of the first SP4T1 switch 111 is isolated. Thus, the power value of the horizontal element of the inputted incident electric field, i.e., the power value Ph of the horizontally polarized wave is outputted through the third terminal of the third SP4T3 switch 115.

Fourth, when all the SP4T switches 111, 112 and 115 are switched to their fourth terminals, respectively. The fourth terminal of the first SP4T1 switch 111 and the fourth terminal of the second SP4T2 switch 112 are respectively connected to the input terminals of the 2-way divider 113. Thus, the 2-way divider 113 adds the power value of the vertically polarized wave to the power value of the horizontally polarized wave. As a result, the power value Pt of the polarized wave which is tilted by 45° with respect to the vertically polarized wave is outputted through the fourth terminal of the third SP4T3 switch 115.

Next, the operation of the polarization measuring apparatus will be explained in detail with reference to FIGS. 2 and 3.

The dual polarization antenna 100 outputs the power value of the vertically polarized wave of the incident electric field for the radio wave inputted thereto through its vertical terminal, and outputs the power value of the horizontally polarized wave through its horizontal terminal.

The output of the vertical terminal of the dual polarization antenna 100 is inputted to the first SP4T1 switch 111 in the polarization switch 110, and the output of the horizontal terminal is inputted to the second SP4T2 switch 112 in the polarization switch 110.

The polarization switch 110 switches the power values of the respective elements of the inputted incident electric field to the first to fourth terminals so that the power values pass through the corresponding paths. The first SP4T1 switch 111 switches the power value of the vertical element of the inputted incident electric field, and the second SP4T2 switch 112 switches the power value of the horizontal element of the inputted incident electric field. At this time, the input terminal position of the third SP4T3 switch 115 is identical to each output terminal position of the first and second SP4T switches 111 and 112.

Consequently, the polarization switch 110 outputs to the band pass filter 120 respective signals which correspond to the power value Pr of the circularly polarized wave, power value Pv of the vertically polarized wave, power value Ph of the horizontally polarized wave, and power value Pt of the polarized wave tilted by 45° with respect to the vertically polarized wave of the incident electric field in accordance with the switching operation of the three SP4T switches 111, 112 and 115 provided in the polarization switch 110.

The spectrum analyzer 140 then measures the different polarization power values Pr, Pv, Ph and Pt inputted according to the switching operation of the polarization switch 110, and outputs the measured power values to the computer (not illustrated).

Figure 6:
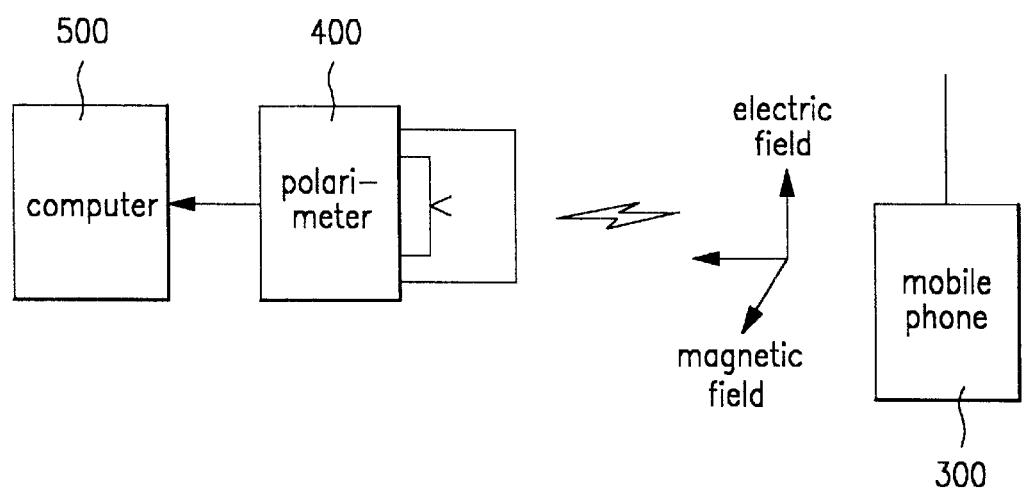
FIG. 6 is a view illustrating the construction of an equipment for measuring the polarization direction for the electric field transmitted from a mobile terminal using the polarization measuring apparatus according to the present invention.

FIG. 6 is a view illustrating the construction of an equipment for measuring the polarization direction for the electric field transmitted from a mobile terminal using the polarization measuring apparatus according to the present invention. The computer 500 illustrated in FIG. 6 finds out the information on the received radio wave using the measured power values provided from the spectrum analyzer 140 in accordance with the following principles.

As described above, the polarization switch 110 provided in a polarimeter 400 outputs to the computer 500 the power value Pr of the circularly polarized wave, power value Pv of the vertically polarized wave, power value Ph of the horizontally polarized wave, and power value Pt of the polarized wave tilted by 45° with respect to the vertically polarized wave of the incident electric field in accordance with the switching operation of the three SP4T switches 111, 112 and 115 provided in the polarization switch 110.

The computer 500 calculates four intermediate parameters I', Q', U' and V' of the following equations 1 to 4 using the power values Pr, Pv, Ph and Pt of the elements of the incident electric field.

$$I' = Pv + Ph \qquad \text{[Equation 1]}$$

$$Q' = Pv - Ph \qquad \text{[Equation 2]}$$

$$U' = Pv + Ph - 2Pt \qquad \text{[Equation 3]}$$

$$V' = 2Pr - Pv - Ph \qquad \text{[Equation 4]}$$

Figure 7:
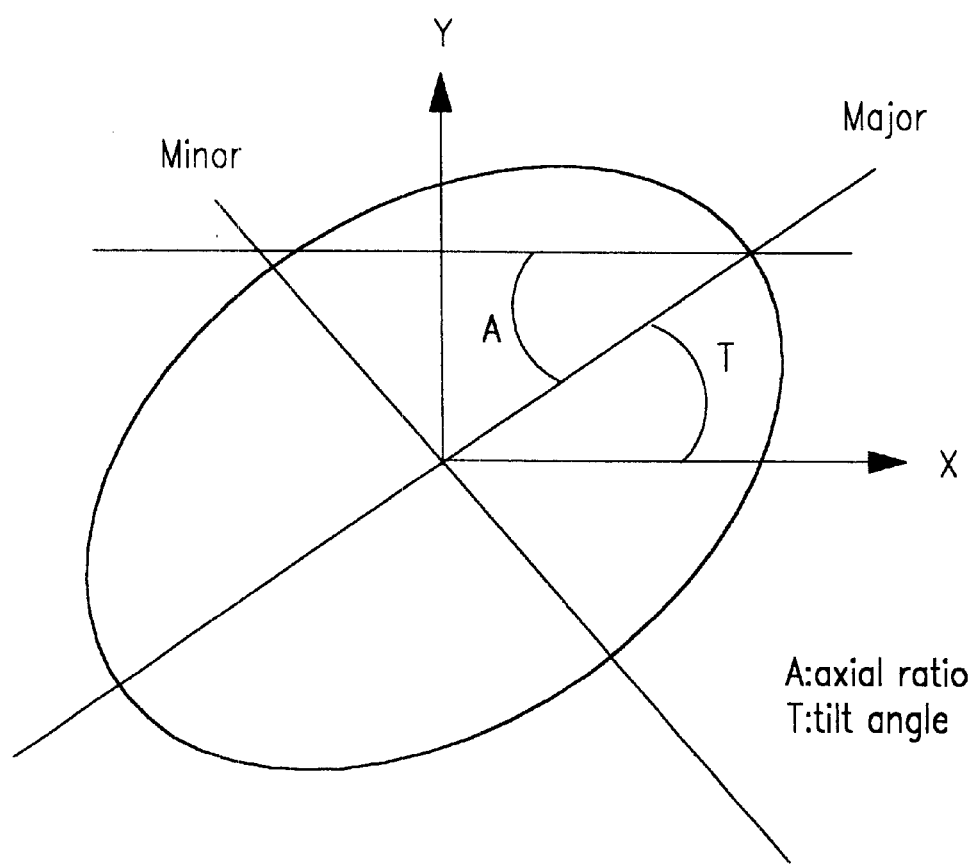
FIG. 7 is a view illustrating a coordinate system representing the elliptically polarized wave generated from a mobile terminal.

Thereafter, the computer 500 calculates the axial ratio and the tilt angle as shown in FIG. 7, which represent the polarization property, by the following equations 5 and 6 using the four intermediate parameters I', Q', U' and V' calculated by the equations 1 to 4.

The equation 5 is for calculating the axial ratio A which is an electric polarization variable, and the equation 6 is for calculating the tilt angle T which is another electric polarization variable.

$$A = \frac{1}{2} \tan^{-1} \frac{U'}{V'} \qquad \text{[Equation 5]}$$

$$T = \frac{1}{2} \sin^{-1}\left[\frac{V'}{(Q'^2 + U'^2 + V'^2)^{0.5}}\right] \quad \text{[Equation 6]}$$

As a result, the information on the received radio wave can be obtained by the electric polarization variables A and T calculated by the equations 5 and 6. Using this information, a more accurate modeling of the propagation of the received wave can be performed, and the polarization diversity can be realized.

The above explanation does not consider the error of the radio frequency (RF) elements in the polarization switch 110 and the loss on paths produced in the polarization switch.

In practice, however, the RF elements provided in the polarization switch 110 may have permissible errors to some extent according to their frequency characteristics, and the different loss on paths may exist due to the difference of length among cables connecting the internal elements in the polarization switch 110.

According to another embodiment of the present invention, the polarization measuring apparatus is proposed to consider the error of the RF elements in the polarization switch 110 and the loss on paths produced in the polarization switch.

Figure 4:
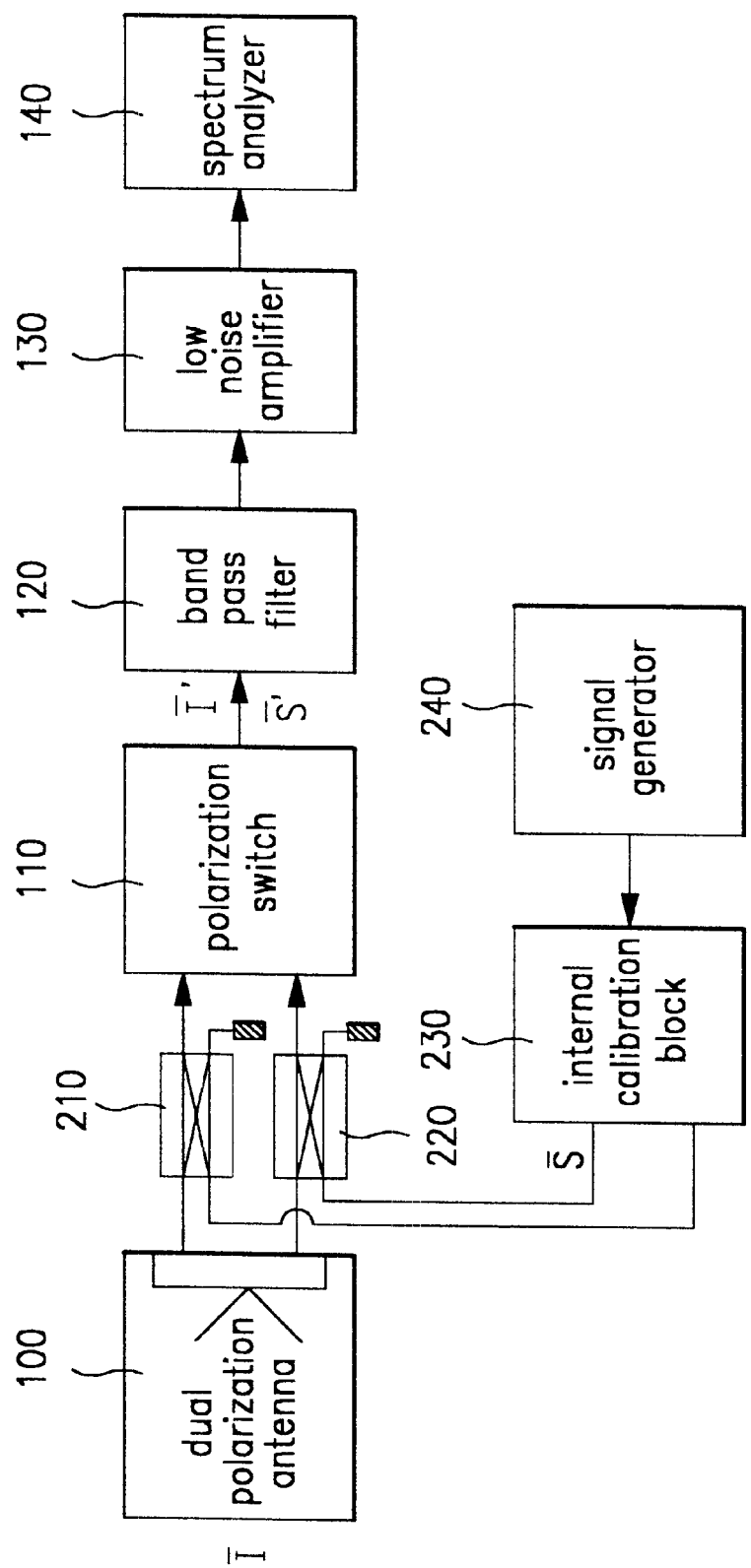
FIG. 4 is a block diagram illustrating the construction of the polarization measuring apparatus according to another embodiment of the present invention.

FIG. 4 is a block diagram illustrating the construction of the polarization measuring apparatus according to another embodiment of the present invention.

Referring to FIG. 4, the polarization measuring apparatus further comprises an internal calibration block 230, directional couplers 210 and 220, and a signal generator 240.

The construction and switching operation of the polarization switch 110 has already been explained in detail with reference to FIG. 3. As described above, there exist the permissible errors in the internal elements of the polarization switch 110 according to their frequency characteristics.

Figure 5:
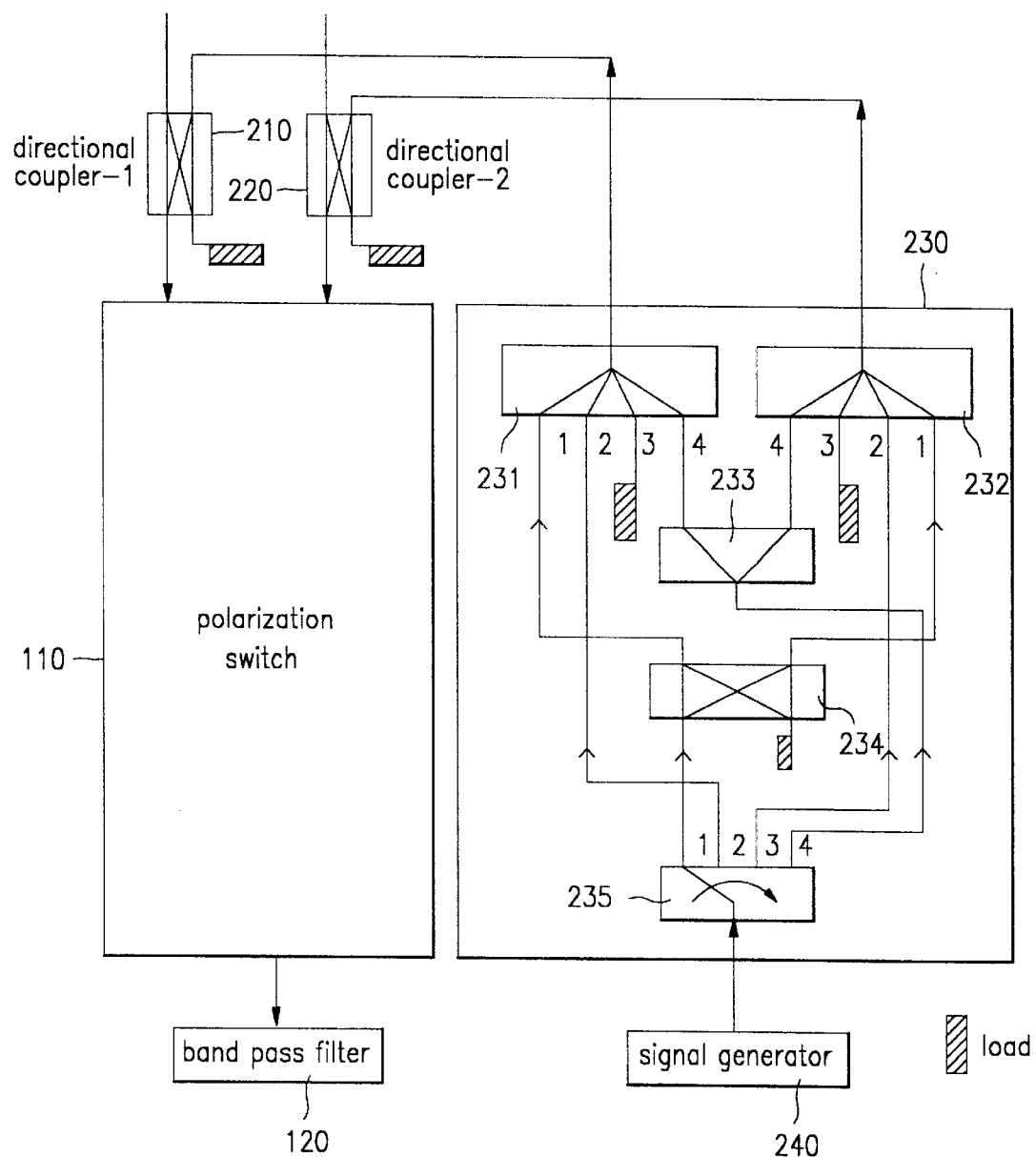
FIG. 5 is a view illustrating the structure of the internal calibration block connected to the polarization switch according to the present invention.

The construction of the internal calibration block 230 connected to the polarization switch 110 is illustrated in FIG. 5. The internal calibration block 230 comprises a single-pole four-threw (SP4T4) switch 235, a 2-way divider 233, a Q-hybrid coupler 234, and 4-way dividers 231 and 232.

The dual polarization antenna 100 is provided with two power supply terminals, i.e., a vertical terminal and a horizontal terminal. The vertical terminal is connected to the first directional coupler 210, and the horizontal terminal is connected to the second directional coupler 220.

The first directional coupler 210 couples either one of the power value of the vertical element of the incident electric field outputted from the dual polarization antenna 100 and an output of the first 4-way divider 231 in the internal calibration block 230, and the second directional coupler 220 couples either one of the power value of the horizontal element of the incident electric field outputted from the dual polarization antenna 100 and an output of the second 4-way divider 232 in the internal calibration block 230.

In connecting the directional couplers 210 and 220 to the polarization switch 110, the first SP4T1 switch 111 provided in the input terminal of the polarization switch 110 is connected to the first directional coupler 210, and the second SP4T2 switch 112 is connected to the second directional coupler 220.

In connecting the directional couplers 210 and 220 to the internal calibration block 230, the first 4-way divider 231 provided on the output terminal of the internal calibration block 230 is connected to the first directional coupler 210, and the second 4-way divider 232 is connected to the second directional coupler 220.

Now, the operation of the polarization measuring apparatus constructed as in FIGS. 4 and 5 will be explained.

In order to compensate for the error of the RF elements and the pass loss produced in the polarization switch 110, a test signal, which is provided from the signal generator 240 and has a predetermined power value P and frequency, is inputted to the internal calibration block 230.

In other words, the test signal generated from the signal generator 240 is inputted to the fourth SP4T4 switch 235 included in the internal calibration block 230. The fourth SP4T4 switch 235 is switched to one of its four input terminals to output the inputted test signal.

The internal calibration block 230 transfers the signals of the polarization power values to the polarization switch 110 by changing its internal switching state.

The output states of the first 4-way divider 231 and the second 4-way divider 232 in accordance with the sequential switching operation of the fourth SP4T4 switch 235 are as follows.

First, when the fourth SP4T4 switch 235 is switched to its first terminal. The two output terminals of the Q-hybrid coupler 234 are respectively connected to a first terminal of the first 4-way divider 231 and a first terminal of the second 4-way divider 232. Thus, the Q-hybrid coupler 234 separates the inputted test signal into two signals having phases different from each other by 900, and outputs the separated signals to the first terminal of the first 4-way divider 231 and the first terminal of the second 4-way divider 232, respectively.

Second, when the fourth SP4T4 switch 235 is switched to its second terminal. The second terminal of the fourth SP4T4 switch 235 is directly connected to the second terminal of the first 4-way divider 231. Thus, the inputted test signal is outputted to the second terminal of the first 4-way divider 231.

Third, when the fourth SP4T switch 235 is switched to its third terminal. The third terminal of the fourth SP4T4 switch 235 is directly connected to the second terminal of the second 4-way divider 232. Thus, the inputted test signal is outputted to the second terminal of the second 4-way divider 232.

Fourth, when the fourth SP4T4 switch is switched to its fourth terminal. The two output terminals of the 2-way divider 233 are respectively connected to the fourth terminal of the first 4-way divider 231 and the fourth terminal of the second 4-way divider 232. Thus, the 2-way divider 233 separates the inputted test signal into two signals, and outputs the separated signals to the fourth terminal of the first 4-way divider 231 and the fourth terminal of the second 4-way divider 232, respectively.

As described above, the output signals of the first 4-way divider 231 and the second 4-way divider 232 are inputted to the polarization switch 110 through the directional couplers 210 and 220 according to the sequential switching operation of the fourth SP4T4 switch 235.

The polarization switch 110 outputs to the band pass filter 120 respective signals which correspond to the four different power values with respect to the output signals of the internal calibration block 230. Specifically, the internal calibration block 230 outputs four signals having different power values for the test signal of the predetermined power value P and frequency which is provided from the signal generator 240, and the polarization switch 110 outputs to the band pass filter 120 sixteen signals having different power values for the four signals provided from the internal calibration block 230.

The band pass filter 120 removes the noise component signal excepting the required band signal to output the filtered band signal to the low noise amplifier 130, and the low noise amplifier 130 amplifies the output signal of the band pass filter 120 with the predetermined amplification factor to transfer the amplified signal to the spectrum analyzer 140.

The spectrum analyzer 140 then measures the compensation values for the various polarization power values of the incident electric field in accordance with the sixteen signals of the different polarization power values outputted from the polarization switch 110, and provides to the computer 500 the polarization power values of the incident electric field measured from the respective power values of the vertical and horizontal elements for the received radio wave and the compensation values for the measured polarization power values.

The computer 500 calculates the four intermediate parameters I', Q', U' and V' of the above-described equations 1 to 4 using the polarization cables power values of the incident electric field, i.e., the power value Pr of the circularly polarized wave, power value Pv of the vertically polarized wave, power value Ph of the horizontally polarized wave, and power value Pt of the polarized wave tilted by 45° with respect to the vertically polarized wave of the incident electric field.

At this time, if it is assumed that I, Q, U and V are the four intermediate parameters obtained by applying to the equations 1 to 4 the polarization power values of the incident electric field which can be calculated at the input position of the dual polarization antenna 100, i.e., the respective ideal polarization power values which do not consider the error and the loss in the polarization switch, the relationship therebetween is given by the following equation 7.

$$\bar{I}' = M \bar{I}$$ [Equation 7]

$$\bar{I}' = \begin{matrix} I' \\ Q' \\ U' \\ V' \end{matrix} = M \bar{I} = M \begin{matrix} I \\ Q \\ U \\ V \end{matrix}$$

In the equation 7, M is a Mueller matrix, which represents the error of the RF elements provided in the polarization switch 110 and the loss on paths produced in the polarization switch 110.

In the equation 7, since $\bar{I}$ is to be finally calculated, it is required for the accurate polarization measurement to obtain the Mueller matrix M which is required for calculating $\bar{I}$.

If there exists no error of the RF elements and no loss on paths produced in the polarization switch, the matrix wherein M is normalized will be a unit matrix.

As described above, if it is assumed that the elements in the polarization switch 110 are ideal, the electric polarization variables A and T are calculated only using the four intermediate parameters I', Q', U' and V' obtained by the equations 1 to 4.

In practice, however, since the RF elements provided in the polarization switch 110 may have the permissible errors to some extent according to their frequency characteristics, and the different loss on paths may exist due to the difference of length among cables connecting the internal elements in the polarization switch 110, the Mueller matrix M should be obtained which represents the error of the RF elements in the polarization switch 110 and the loss on paths produced in the polarization switch.

As a result, according to the switched positions of the input terminals of the 4-way dividers 231 and 232 which are caused by the switching operation of the fourth SP4T4 switch 235 to its first to fourth terminals, the vector $\bar{I}=[I, Q, U, V]^T$ can be represented as $\bar{I}_1, \bar{I}_2, \bar{I}_3, \bar{I}_4$ for the respective switching positions at the output terminal of the internal calibration block 230, and the vector $\bar{I}'=[I', Q', U', V']^T$ can be represented as $\bar{I}_1', \bar{I}_2', \bar{I}_3', \bar{I}_4'$ for the respective switching positions at the output terminal of the polarization switch 110.

At this time, the Mueller matrix M has the relationship given by the following equation 8.

$$\hat{S}' = M\hat{S}$$ [Equation 8]

In the equation 8, $\hat{S}'=[\bar{I}_1', \bar{I}_2', \bar{I}_3', \bar{I}_4']$, and $\hat{S}=[\bar{I}_1, \bar{I}_2, \bar{I}_3, \bar{I}_4]$.

As a result, in the equation 8, $\hat{S}'$ is a vector represented by the polarization power values actually measured at the output terminal of the polarization switch 110, and respective vectors in $\hat{S}$ are known values which can be represented by the following equation 9.

$$\bar{I}_1 = [0 \quad 0 \quad 0 \quad 2P]^T = \begin{matrix} 0 \\ 0 \\ 0 \\ 2P \end{matrix}$$ [Equation 9]

$$\bar{I}_2 = [P \quad P \quad P \quad -P]^T = \begin{matrix} P \\ P \\ P \\ -P \end{matrix}$$

$$\bar{I}_3 = [P \quad -P \quad P \quad -P]^T = \begin{matrix} P \\ -P \\ P \\ -P \end{matrix}$$

$$\bar{I}_4 = [0 \quad 0 \quad -2P \quad 0]^T = \begin{matrix} 0 \\ 0 \\ -2P \\ 0 \end{matrix}$$

As a result, the Mueller matrix M, which represents the error of the RF elements provided in the polarization switch 110 and the loss on paths produced in the polarization switch 110, is obtained by the following equation 10.

$$M = \hat{S}^{-1}\hat{S}'$$ [Equation 10]

By applying to the equation 7 the Mueller matrix calculated by the equation 10, the electric polarization variables A and T illustrated in FIG. 7 can be more accurately calculated by the following equations 11 and 12 even though there exist the error of the RF elements in the polarization switch 110 and the loss on paths produced in the polarization switch. Accordingly, the accurate polarization information for the received radio wave can be obtained.

$$A = \frac{1}{2}\tan^{-1}\frac{U}{V} = \frac{1}{2}\tan^{-1}\frac{U'}{V'}$$ [Equation 11]

$$T = \frac{1}{2}\sin^{-1}\left[\frac{V}{(Q^2+U^2+V^2)^{0.5}}\right] = \frac{1}{2}\sin^{-1}\left[\frac{V'}{(Q'^2+U'^2+V'^2)^{0.5}}\right]$$ [Equation 12]

However, the identical relationship represented in the equations 11 and 12 is effected only if the matrix wherein the Mueller matrix M is normalized is a unit matrix.

As described above, the polarization measuring apparatus in a mobile communication system according to the present invention can accurately measure the polarization information on the received radio wave irrespective of the error of the RF elements provided in the polarization switch and the loss on paths produced in the polarization switch, and thus it can obtain an accurate information on the elliptically polarized wave wherein the propagation direction of the polarized wave varies occasionally as well as the linearly polarized wave when the CDMA signal having a wide frequency band is used and when a number of scattering substances exist in the wave propagation environment. Accordingly, the polarization measuring apparatus according to the present invention facilitates the more accurate modeling of the wave propagation and the realization of the polarization diversity.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A polarization measuring apparatus in a mobile communication system comprising:
   a dual polarization antenna for outputting power values of vertical and horizontal elements of an incident electric field for a received radio wave;
   a polarization switch for switching to its different paths the power values of the respective elements of the incident electric field inputted from the dual polarization antenna, and outputting a plurality of polarization power values of the incident electric field;
   a spectrum analyzer for measuring the respective polarization power values outputted from the polarization switch; and
   a computer for receiving the measured polarization power values and analyzing polarization properties of the received radio wave according to the measured polarization power values.

2. The polarization measuring apparatus of claim 1, wherein the polarization switch comprises:
   a first switch for switching the power value of the vertical element of the incident electric field inputted from the dual polarization antenna to its different paths;
   a second switch for switching the power value of the horizontal element of the incident electric field inputted from the dual polarization antenna to its different paths;
   a divider for combining the power value switched by the first switch with the power value switched by the second switch, and outputting the combined power value; and
   a quadrature-hybrid (Q-hybrid) coupler for making the power value switched by the first switch and the power value switched by the second switch have a predetermined phase difference from each other, combining the two power values, and outputting the combined power value.

3. The polarization measuring apparatus of claim 1, wherein the polarization switch further comprises a third switch for switching and selectively outputting one of the power value switched by the first switch, the power value switched by the second switch, the power value outputted from the divider, and the power value outputted from the Q-hybrid coupler.

4. The polarization measuring apparatus of claim 3, wherein the first to third switches perform their switching operation so that a position of an output terminal of the first switch, a position of an output terminal of the second switch, and a position of an input terminal of the third switch coincide with one another.

5. The polarization measuring apparatus of claim 3, wherein one among the power value Pr of a circularly polarized wave, the power value Pv of a vertically polarized wave, the power value Ph of a horizontally polarized wave, and the power value Pt of a polarized wave tilted by approximately 45° with respect to the vertically polarized wave of the incident electric field is selectively outputted in accordance with a switching operation of the the switch.

6. The polarization measuring apparatus of claim 1, wherein the computer calculates an ellipticity and a tilt angle of polarization of the received radio wave using the plurality of polarization power values of the incident electric field provided from the polarization measuring apparatus and compensation information for an error of internal radio frequency (RF) elements and for a loss on internal paths of the polarization measuring apparatus.

7. A polarization measuring apparatus in a mobile communication system comprising:
   a signal generator for generating a test signal having a predetermined power value and frequency;
   an internal calibration block for outputting a plurality of polarization power values for the test signal provided from the signal generator by switching the test signal to different paths;
   a dual polarization antenna for outputting power values of vertical and horizontal elements of an incident electric field for a received radio wave;
   a polarization switch for switching to its different paths the power values of the respective elements of the incident electric field inputted from the dual polarization antenna to output a plurality of polarization power values of the incident electric field, and for switching to its different paths the test signal inputted from the internal calibration block to output the plurality of polarization power values;
   a spectrum analyzer for measuring the respective polarization power values outputted from the polarization switch; and
   a computer for receiving the measured polarization power values and analyzing polarization properties of the received radio wave according to the measured polarization power values.

8. The polarization measuring apparatus of claim 7, wherein the internal calibration block comprises:
   a first directional coupler for selectively outputting one of the vertical element power value of the incident electric field inputted from the dual polarization antenna and one polarization power value inputted from the internal calibration block; and
   a second directional coupler for selectively outputting one of the horizontal element power value of the incident electric field inputted from the dual polarization antenna and another polarization power value inputted from the internal calibration block.

9. The polarization measuring apparatus of claim 7, wherein the internal calibration block further comprises:
   a switch for switching the test signal inputted from the signal generator to its different paths;

a quadrature-hybrid (Q-hybrid) coupler for separating one signal switched by the switch into two signals having a predetermined phase difference from each other, and outputting the two separated signals; and a first divider for separating another signal switched by the switch into two signals, and outputting the two separated signals.

10. The polarization measuring apparatus of claim 7, wherein the internal calibration block further comprises:

a second divider for receiving and combining one output signal switched by the switch, an output signal of the Q-hybrid coupler, and an output signal of the divider, and outputting a combined signal; and a third divider for receiving and combining another output signal switched by the switch, another output signal of the Q-hybrid coupler, and another output signal of the divider, and outputting a combined signal.

11. The polarization measuring apparatus of claim 10, wherein output signals of the dividers are used for compensating for the polarization power values of the incident electric field outputted from the polarization switch.

* * * * *